US010847651B2

(12) United States Patent
Iwaki

(10) Patent No.: US 10,847,651 B2
(45) Date of Patent: Nov. 24, 2020

(54) SEMICONDUCTOR DEVICES INCLUDING ELECTRICALLY CONDUCTIVE CONTACTS AND RELATED SYSTEMS AND METHODS

(71) Applicant: Micron Technology, Inc., Boise, ID (US)

(72) Inventor: Takayuki Iwaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 16/038,387

(22) Filed: Jul. 18, 2018

(65) Prior Publication Data
US 2020/0027982 A1   Jan. 23, 2020

(51) Int. Cl.
| | | |
|---|---|---|
| *H01L 29/78* | (2006.01) | |
| *H01L 21/768* | (2006.01) | |
| *H01L 21/033* | (2006.01) | |
| *H01L 29/06* | (2006.01) | |
| *H01L 29/66* | (2006.01) | |
| H01L 27/11582 | (2017.01) | |

(52) U.S. Cl.
CPC ...... *H01L 29/7827* (2013.01); *H01L 21/0332* (2013.01); *H01L 21/0337* (2013.01); *H01L 21/76802* (2013.01); *H01L 21/76885* (2013.01); *H01L 29/0649* (2013.01); *H01L 29/66545* (2013.01); H01L 27/11582 (2013.01)

(58) Field of Classification Search
CPC ............. H01L 29/7827; H01L 29/66545
See application file for complete search history.

(56) References Cited

U.S. PATENT DOCUMENTS

| | | | | |
|---|---|---|---|---|
| 5,295,114 A | * | 3/1994 | Kobayashi | ........... G11C 29/832 365/200 |
| 5,434,109 A | | 7/1995 | Geissler et al. | |
| 6,128,209 A | | 10/2000 | Kuroki | |
| (Continued) | | | | |

FOREIGN PATENT DOCUMENTS

| | | |
|---|---|---|
| KR | 10-2008-0039099 A | 5/2008 |
| KR | 10-2009-0110691 A | 10/2009 |
| KR | 10-2011-0062414 A | 6/2011 |

OTHER PUBLICATIONS

International Search Report from International Application No. PCT/US2019/040993, dated Oct. 31, 2019, 3 pages.

(Continued)

*Primary Examiner* — Jay C Chang
*Assistant Examiner* — Mikka Liu
(74) *Attorney, Agent, or Firm* — TraskBritt

(57) ABSTRACT

A semiconductor device comprises an array region, a dummy region, pillars of an electrically insulative material in the array region and the dummy region. The semiconductor device further comprises electrically conductive contacts between adjacent pillars of the electrically insulative material in the array region, another electrically insulative material between adjacent pillars of the electrically insulative material in the dummy region, an electrically conductive material over the conductive contacts in the array region and over the electrically insulative material in the dummy region, and an oxide between the electrically conductive material in the dummy region and the electrically insulative material in the dummy region. Related semiconductor devices, systems, and methods are also disclosed.

23 Claims, 6 Drawing Sheets

(56) References Cited

U.S. PATENT DOCUMENTS

| | | | | |
|---|---|---|---|---|
| 6,130,449 | A | * | 10/2000 | Matsuoka ......... H01L 27/10894 |
| | | | | 257/296 |
| 9,036,408 | B1 | * | 5/2015 | Jurasek ................ G11C 13/004 |
| | | | | 365/163 |
| 2002/0182893 | A1 | | 12/2002 | Ballantine et al. |
| 2004/0005786 | A1 | | 1/2004 | Song et al. |
| 2004/0046213 | A1 | * | 3/2004 | Hanzawa .................. G11C 7/14 |
| | | | | 257/390 |
| 2010/0270643 | A1 | | 10/2010 | Iwaki |
| 2010/0330791 | A1 | | 12/2010 | Kang et al. |
| 2011/0228583 | A1 | * | 9/2011 | Noguchi ................ G11C 5/025 |
| | | | | 365/63 |
| 2011/0305074 | A1 | * | 12/2011 | Lung .................. H01L 27/2445 |
| | | | | 365/163 |
| 2013/0089964 | A1 | | 4/2013 | Iwaki et al. |

OTHER PUBLICATIONS

International Written Opinion from International Application No. PCT/US2019/040993, dated Oct. 31, 2019, 9 pages.

* cited by examiner

SEMICONDUCTOR DEVICES INCLUDING ELECTRICALLY CONDUCTIVE CONTACTS AND RELATED SYSTEMS AND METHODS

TECHNICAL FIELD

Embodiments disclosed herein relate to the field of semiconductor device design and fabrication. More specifically, embodiments of the disclosure relate to methods of forming electrically conductive contacts in an array region of a semiconductor device, and to related semiconductor devices and systems.

BACKGROUND

Semiconductor devices may include several electrically conductive interconnects between different components thereof. For example, the semiconductor device may include an active surface including active components, such as transistors, capacitors, electrodes, diodes, other access devices, or other components. During fabrication of the semiconductor device, electrical connections may be formed between the active surface of the semiconductor device and other portions thereof to form electrical connections to circuitry located away from the active surface.

A conventional semiconductor device may include an array region (which may also be referred to as a "memory array area," an "active area," or an "array area") and a peripheral region around at least a portion of the array region. The array region may include memory cells arranged in, for example, rows and columns. The peripheral region may include peripheral circuits for operating the semiconductor device, such as sense amplifiers, decoder circuits, control circuits, multiplexers, column decoders, row decoders, word line drivers, or other control logic devices and circuits for operating the semiconductor device.

The semiconductor device may also include a dummy region located between the peripheral region and the array region. The dummy region may provide a buffer between relatively closely spaced memory cells in the array region and relatively further spaced components of the peripheral region. The dummy region may include dummy word lines, dummy bit lines, and dummy memory cells. The dummy region may provide a transition region between the relatively smaller critical dimension of components within the array region (e.g., word line width, the bit line depth, and other components of the memory cells) and the relatively larger critical dimension between components (e.g., electrically conductive traces, conductive pads, etc.) of the peripheral region.

However, during fabrication of conventional semiconductor devices, patterning of electrically conductive contact openings in the array region may undesirably form openings in the dummy region and the peripheral region. For example, in some instances, wet etchants used to form the openings in the array region may penetrate (e.g., infiltrate) under a photoresist material and into the dummy region and the peripheral region, removing electrically insulative materials within the dummy region and the peripheral region. When the openings in the array region are filled with an electrically conductive material, the undesired openings in the dummy region and the peripheral region may be filled with the electrically conductive material, which may result in a short circuit between electrically conductive components undesirably formed in the dummy region and one or more components within the peripheral region and the array region. For example, during operation of the semiconductor device, a short circuit may occur in the dummy region and the peripheral region.

DETAILED DESCRIPTION

Figure 1A:
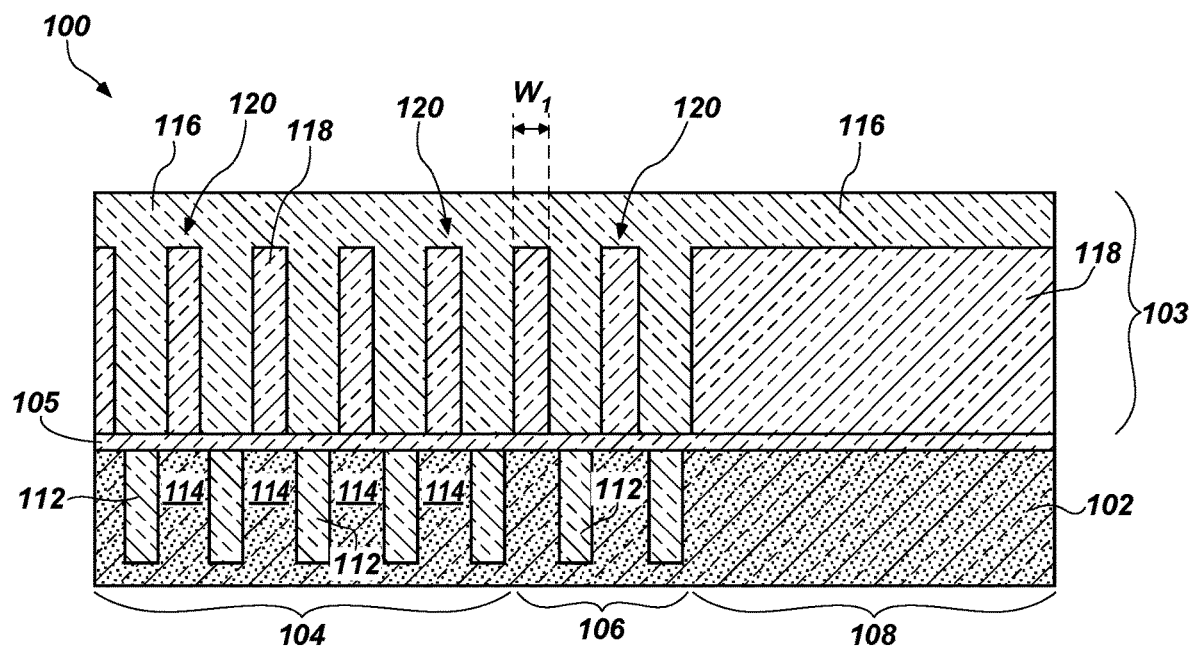
FIG. 1A through FIG. 1J are simplified cross-sectional views illustrating a method of forming electrically conductive contact openings in a semiconductor device and of forming the semiconductor device, in accordance with embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device including electrically conductive contacts or a complete description of a process flow for fabricating such electrically conductive contacts or semiconductor devices. The structures described below do not form complete semiconductor device structures. Only those process acts and structures necessary to understand the embodiments described herein are described in detail below. Additional acts to form a complete semiconductor device or electrically conductive contacts may be performed by conventional techniques.

As used herein, the terms "longitudinal," "vertical," "lateral," and "horizontal" are in reference to a major plane of a substrate (e.g., base material, base structure, base construction) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

According to embodiments described herein, a semiconductor device includes an active region, a peripheral region, and a dummy region between the active region and the peripheral region. A first electrically insulative material includes distinct portions (e.g., pillars) in the active region and in the dummy region. In the active region, electrically conductive contacts are located between adjacent pillars of the first electrically insulative material. The electrically conductive contacts are in electrical communication with an active surface of an underlying substrate. A second electrically insulative material, different than the first electrically insulative material, may overlie the substrate in the peripheral region. In the dummy region, the second electrically insulative material may be located between adjacent pillars of the first electrically insulative material. Upper surfaces of the first electrically insulative material may be located farther from the substrate (e.g., higher, above) than upper surfaces of the second electrically insulative material. Upper portions of the first electrically insulative material in the dummy region may be oxidized. An electrically conductive material may be patterned over the active region, the dummy region, and the peripheral region. In the active region, the electrically conductive material may form an electrical connection to the electrically conductive contacts. The electrically conductive material over the dummy region may be electrically isolated from the electrically conductive material over the array region and the electrically conductive material over the peripheral region. Memory storage elements (e.g., capacitors) may overlie the electrically conductive material in the array region and in the dummy region. In the array region, the memory storage elements may be in electrical communication with the active surface of the substrate through the electrically conductive material and the electrically conductive contacts. Since the dummy region may not include the electrically conductive contacts (and includes the second electrically insulative material), the memory storage elements in the dummy region may not be in electrical communication with the active surface of the substrate.

The semiconductor device may be formed by forming the second electrically insulative material over the substrate and forming openings therein in the active region and the dummy region. The first electrically insulative material may be formed within the openings. Portions of the second electrically insulative material may be removed such that upper surfaces of the second electrically insulative material are located lower than upper surfaces of the first electrically insulative material. During removal of the portions of the second electrically insulative material, upper portions (e.g., oxidized portions) of the first electrically insulative material may be removed, leaving dangling bonds on the exposed surfaces of the first electrically insulative material. Upper portions of the first electrically insulative material including the dangling bonds may be oxidized to form an oxide on the exposed portions thereof. After oxidizing exposed portions of the first electrically insulative material, a mask material (e.g., a photoresist material) may be formed and bonded to the oxidized portions over the dummy region and over the second electrically insulative material in the peripheral region. The second electrically insulative material is removed from the active region to form openings between pillars of the first electrically insulative material. The openings are filled with an electrically conductive material to form electrically conductive contacts in electrical communication with the active surface in the active region. An electrically conductive material is formed and patterned over the active region, the dummy region, and the peripheral region. In some embodiments, memory storage elements are formed in electrical communication with the electrically conductive material in the active region. The memory storage elements may be in electrical communication with the active surface since the electrically conductive material is in electrical communication with the electrically conductive contacts in the array region.

Oxidation of the exposed portions of the first electrically insulative material may reduce an amount of dangling bonds of the first electrically insulative material. Since the exposed portions of the first electrically insulative material are substantially free of dangling bonds, the mask material may directly bond (e.g., chemically bond) with the oxidized portion. A boundary between the array region and the dummy region may be defined by an edge of the mask material, which may be chemically bonded to the oxidized portion of the first electrically insulative material. Since the mask material is chemically bonded to the oxidized portion, etchants (e.g., wet etchants) used to remove the second electrically insulative material from the array region may not penetrate to the dummy region or the peripheral region. Accordingly, during subsequent processing of the semiconductor device, the electrically conductive contacts and electrically conductive material in the array region may not form short circuits to electrically conductive materials in the dummy region. In addition, the electrically conductive materials in the dummy region may not short to electrically conductive materials in the peripheral region. Accordingly, contact openings may be formed in the array region without substantially forming openings in the dummy region or the peripheral region.

FIG. 1A through FIG. 1J illustrate a method of forming electrically conductive contact openings in a semiconductor device and of forming the semiconductor device, in accordance with embodiments of the disclosure. Referring to FIG. 1A, a semiconductor device 100 may include a substrate 102 on or in which components of the semiconductor device 100 may be formed. The substrate 102 may be a base material (e.g., structure) or a construction upon which additional materials are formed. The substrate 102 may be a semiconductor substrate, a base semiconductor layer on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped.

An upper portion of the substrate 102 may include active regions 114, which may comprise a portion of, for example, memory cells. By way of nonlimiting example, the active regions 114 may comprise a portion of a transistor (e.g., a source region, a drain region), a portion of a capacitor structure, a gate electrode, a diode, another access device, another material, or combinations thereof. In some embodiments, the active regions 114 comprise source regions or drain regions of a transistor. In other embodiments, some of the active regions 114 comprise source regions and others of the active regions 114 comprise drain regions. As will be described herein, electrically conductive contacts may be formed in electrical communication with the active regions 114 to electrically connect the active regions 114 to other circuits or components of the semiconductor device 100. A contact region 103 may be located over the substrate 102 and may be a region through which the electrically conductive contacts are formed from an upper surface of the semiconductor device 100 to the active regions 114 of the substrate 102.

An etch stop material 105 may be located between the substrate 102 and the contact region 103. In some embodiments, the etch stop material 105 comprises silicon nitride. However, the disclosure is not so limited and the etch stop material 105 may comprise other materials, such as, for example, aluminum nitride, aluminum oxide, silicon carbon nitride (SiCN), another material, or combinations thereof.

The semiconductor device 100 may include an active region 104, a peripheral region 108, and a dummy region 106 between the active region 104 and the peripheral region 108. The active region 104 may include memory cells or components thereof (e.g., transistors) patterned in, for example, rows extending in a first direction and columns extending in a second direction, which may be perpendicular to the first direction. In other embodiments, the memory cells may be arranged in a different configuration, such as in a hexagonal close-packed orientation for increasing a density of the memory elements (e.g., the memory cells).

The active region 104 may include isolation regions 112 formed within the substrate 102, the isolation regions 112 separating the active regions 114 from each other. The isolation regions 112 may be referred to herein as shallow trench isolation (STI) structures. The isolation regions 112 may include, for example, an electrically insulative material. The electrically insulative material may include a dielectric material such as, for example, silicon dioxide, silicon nitride, phosphosilicate glass, borosilicate glass, borophosphosilicate glass (BPSG), fluorosilicate glass, a nitride material, an oxynitride (e.g., silicon oxynitride, another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the isolation regions 112 comprise silicon dioxide.

The active region 104 may further include a first electrically insulative material 116 located between distinct portions 120 of a second electrically insulative material 118. The distinct portions 120 may have a width $W_1$ ranging from about 20 nanometers (nm) to about 40 nm, such as from about 20 nm to about 25 nm, from about 25 nm to about 30 nm, from about 30 nm to about 35 nm, or from about 35 nm to about 40 nm. In some embodiments, the width $W_1$ is from about 27 nm to about 30 nm.

A lower portion of the second electrically insulative material 118 may be substantially aligned (e.g., in the left and right direction in the view shown in FIG. 1A) with the active regions 114 of the substrate 102. In some such embodiments, the second electrically insulative material 118 may be offset from the isolation regions 112. The first electrically insulative material 116 may include portions located above and aligned with the isolation regions 112.

The second electrically insulative material 118 may comprise a sacrificial material, which may be replaced with an electrically conductive material to form the electrically conductive contacts, as will be described herein. The second electrically insulative material 118 may comprise, for example, silicon dioxide, phosphosilicate glass, borosilicate glass, borophosphosilicate glass (BPSG), fluorosilicate glass, a nitride material, an oxynitride (e.g., silicon oxynitride, another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the second electrically insulative material 118 comprises silicon dioxide.

The first electrically insulative material 116 between the distinct portions 120 of the second electrically insulative material 118 may comprise a material exhibiting an etch selectivity relative to the second electrically insulative material 118. Stated another way, the first electrically insulative material 116 may include a material that may be patterned or removed without substantially removing the second electrically insulative material 118. Similarly, the second electrically insulative material 118 may include a material that may be removed without substantially removing the first electrically insulative material 116. In some embodiments, the first electrically insulative material 116 comprises a nitride material, such as silicon nitride. In some such embodiments, the second electrically insulative material 118 may comprise an oxide material, such as silicon dioxide.

With continued reference to FIG. 1A, the dummy region 106 may include at least some distinct portions 120 of the second electrically insulative material 118 and the first electrically insulative material 116 located between the adjacent portions of the second electrically insulative material 118. Although FIG. 1A illustrates that the dummy region 106 includes two distinct portions 120, the disclosure is not so limited and the dummy region 106 may include only one distinct portion 120, or may include more than two distinct portions 120, such as three distinct portions 120, four distinct portions 120, five distinct portions 120, or another number of distinct portions 120.

The peripheral region 108 may include the second electrically insulative material 118 located over the etch stop material 105. The second electrically insulative material 118 may comprise a substantially continuous material over the substrate 102 in the peripheral region 108. The first electrically insulative material 116 may overlie the second electrically insulative material 118 in the peripheral region 108.

The semiconductor device 100 of FIG. 1A may be formed by forming the second electrically insulative material 118 over surfaces of the substrate 102. The second electrically insulative material 118 may be patterned to form openings (e.g., apertures) between adjacent distinct portions 120. By way of nonlimiting example, the openings may be formed by forming a mask material (e.g., photoresist material) over the second electrically insulative material 118, exposing and removing portions of the mask material, and transferring a pattern of the mask material to the second electrically insulative material 118. The openings in the second electrically insulative material 118 may be formed by exposing the second electrically insulative material 118 to wet etching conditions, such as exposing the second electrically insulative material 118 to a solution including hydrofluoric acid (HF), potassium hydroxide (KOH), a solution including hydrofluoric acid and ammonium fluoride ($NH_4F$), a solution including sulfuric acid and hydrogen peroxide (also referred to as a Piranha solution), another wet etchant, or combinations thereof. In other embodiments, the openings in the second electrically insulative material 118 may be formed by exposing the second electrically insulative material 118 to a dry etching process, such as a reactive ion etch (RIE) process. In some such embodiments, the dry etchant may include $SF_6$, $NH_3$, $CF_4/O_2$, $CF_4/H_2$, $CF_4$, $CHF_3/O_2$, $C_2F_6$, $C_3F_8$, $C_5F_8/CO/O_2/Ar$, other etch chemistries, or combinations thereof.

The openings may be filled with the first electrically insulative material 116. The first electrically insulative material 116 may be formed by, for example, atomic layer deposition (ALD), physical vapor deposition (PVD), chemical vapor deposition (CVD), low-pressure chemical vapor deposition (LPCVD), plasma-enhanced chemical vapor deposition (PECVD), another deposition method, or combinations thereof.

Figure 1B:
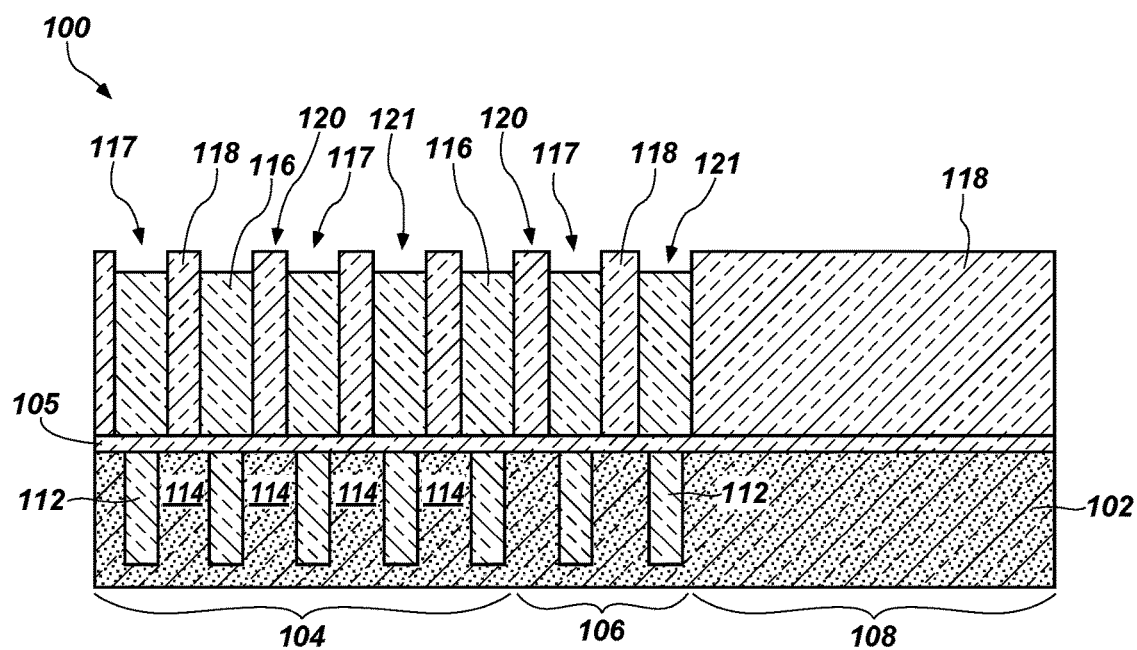

With reference to FIG. 1B, portions of the first electrically insulative material 116 overlying surfaces of the second electrically insulative material 118 may be removed to form isolated pillars 121 of the first electrically insulative material 116 and expose upper portions of the second electrically insulative material 118. Accordingly, the second electrically insulative material 118 may extend further from the substrate 102 than a remainder of the first electrically insulative material 116.

In some embodiments, the first electrically insulative material 116 is removed such as by exposing the first electrically insulative material to a dry etching process (e.g., a RIE process). By way of nonlimiting example, the first electrically insulative material 116 may be removed by exposing the first electrically insulative material 116 to, for example, $CF_4/H_2$, $CF_4/O_2/N_2$, $NF_3/O_2$, $SF_6/O_2/N_2$, $SF_6/CH_4/N_2$, another material, or combinations thereof. In some embodiments, the first electrically insulative material 116 is removed by exposure to $CF_4/H_2$.

Removing portions of the first electrically insulative material 116 may form recessed portions 117 of the first electrically insulative material 116. In some such embodiments, an upper surface of the first electrically insulative material 116 may be lower (e.g., located closer to a major surface of the substrate 102) than an upper surface of the distinct portions 120 of the second electrically insulative material 118 in the active region 104. In some embodiments, the upper surfaces of the first electrically insulative material 116 may be lower than an upper surface of the second electrically insulative material 118 in the peripheral region 108.

Figure 1C:
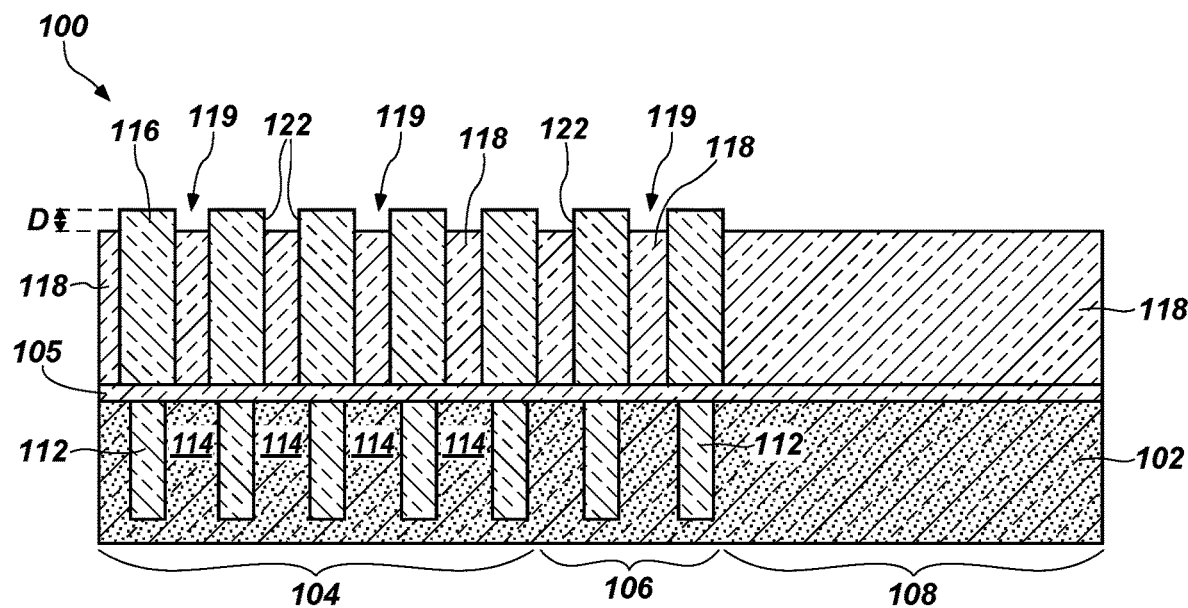

Referring to FIG. 1C, after removing portions of the first electrically insulative material 116, portions of the second electrically insulative material 118 between the distinct portions 120 (FIG. 1B) may be removed to form recessed portions 119 of the second electrically insulative material 118. Upper surfaces of the second electrically insulative material 118 may be located closer to the substrate 102 than upper surfaces of the first electrically insulative material 116.

In some embodiments, the portions of the second electrically insulative material 118 are removed by, for example, wet etching. In some such embodiments, the second electrically insulative material 118 may be exposed to a solution including hydrofluoric acid, potassium hydroxide, a solution including hydrofluoric acid and ammonium fluoride, a solution including sulfuric acid and hydrogen peroxide, another wet etchant, or combinations thereof. In some embodiments, exposing the second electrically insulative material 118 to the wet etchant may remove oxidized portions of the first electrically insulative material 116 and may leave dangling bonds (e.g., exposed hydrogen ($H^+$) atoms) on exposed surfaces of the first electrically insulative material 116.

In some embodiments, a distance D between an upper surface of the first electrically insulative material 116 and an upper surface of the second electrically insulative material 118 may be from about 1 nanometer to about 10 nm, such as from about 1 nm to about 5 nm, or from about 5 nm to about 10 nm, although the disclosure is not so limited. In some embodiments, the distance D is from about 1 nm to about 5 nm, such as about 2 nm, which may facilitate removal of the first electrically insulative material 116 that may be located on surfaces of the second electrically insulative material 118.

Forming the recessed portions 119 may expose at least upper portions (e.g., upper portions of sidewalls) of the first electrically insulative material 116. At least a portion of sidewalls 122 of the first electrically insulative material 116 and an upper surface of the first electrically insulative material 116 may be exposed (e.g., not in contact with the second electrically insulative material 118).

Figure 1D:
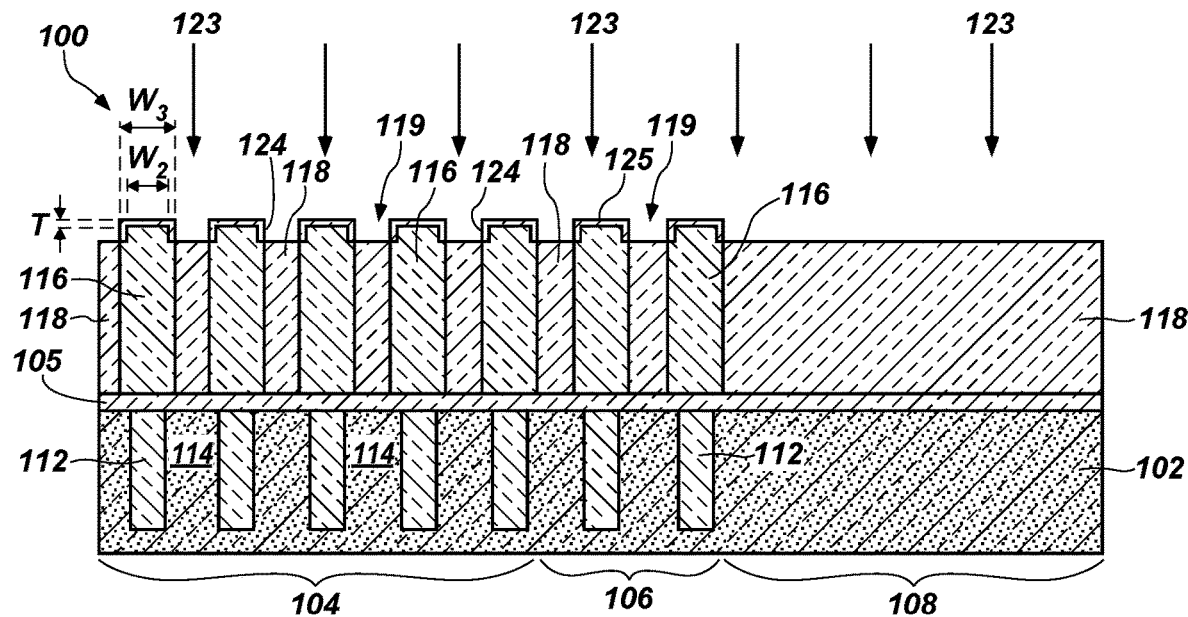

Referring to FIG. 1D, the semiconductor device 100 may be exposed to oxidizing conditions, as indicated at arrows 123, to oxidize at least some exposed surfaces of the first electrically insulative material 116 and form an oxide 124 over surfaces of the first electrically insulative material 116. For example, exposed portions of the sidewalls 122 and the upper surface of the first electrically insulative material 116 may be oxidized. In some embodiments, exposing the semiconductor device 100 to oxidizing conditions may substantially remove the dangling bonds from exposed surfaces of the first electrically insulative material 116.

In some embodiments, exposing the semiconductor device 100 to oxidizing conditions may include exposing the exposed portions of the first electrically insulative material 116 (FIG. 1C) to a rapid thermal annealing (RTA) process. For example, the semiconductor device 100 may be exposed to an oxidizing environment (e.g., air, oxygen, ozone, water vapor, an oxygen-containing plasma (e.g., a plasma including oxygen radicals), another oxidizing agent, or combinations thereof) at an elevated temperature (e.g., a temperature greater than about 20° C.). In some embodiments, the semiconductor device 100 may be exposed to a temperature greater than about 300° C., such as greater than about 400° C., greater than about 600° C., greater than about 800° C., greater than about 1,000° C., or greater than about 1,200° C. during oxidation of the exposed portions of the first electrically insulative material 116. In some embodiments, the semiconductor device 100 is exposed to the oxidizing conditions for a duration ranging from about 30 seconds to about 10 minutes, such as from about 30 seconds to about 1 minute, from about 1 minute to about 3 minutes, from about 3 minutes to about 5 minutes, or from about 5 minutes to about 10 minutes.

The oxide 124 may include an oxide of the first electrically insulative material 116. In some embodiments, such as where the first electrically insulative material 116 comprises silicon nitride, the oxide 124 comprises a silicon oxide ($SiO_x$), wherein x is between about 1.0 and about 2.0). In other embodiments, the oxide 124 comprises silicon oxynitride (e.g., SiON).

A thickness T of the oxide 124 may range from about 3 Å to about 20 Å, such as from about 3 Å to about 5 Å, from about 5 Å to about 10 Å, from about 10 Å to about 15 Å, or from about 15 Å to about 20 Å. However, the disclosure is not so limited and the thickness T of the oxide 124 may be greater than the thicknesses described above.

Oxidation of the exposed portions of the first electrically insulative material 116 may thin the exposed portions thereof. For example, upper portions of the first electrically insulative material 116 may have a width $W_2$ that is less than a width $W_3$ of other portions of the first electrically insulative material 116 not exposed to the oxidizing conditions (e.g., portions of the first electrically insulative material 116 that are buried within the second electrically insulative material 118).

Oxidation of the exposed portions of the first electrically insulative material 116 may form exposed surfaces 125 of the oxide 124 having hydrophobic properties such that a mask material (e.g., a mask material comprising a photoresist material) formed thereon adheres to the oxidized portion of the first electrically insulative material 116.

Figure 1E:
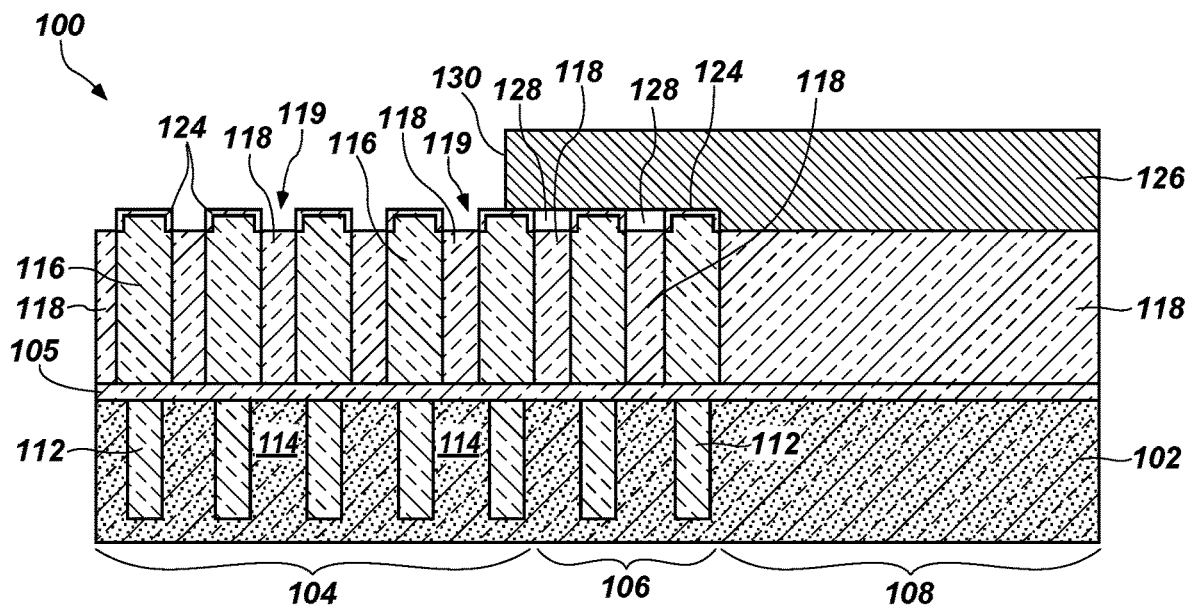

Referring to FIG. 1E, a mask material 126, which may comprise a photoresist material, may be formed over the peripheral region 108 and the dummy region 106 of the semiconductor device 100. The mask material 126 may overlie and contact the second electrically insulative material 118 in the peripheral region 108. The mask material 126 may overlie and contact the oxide 124 in the dummy region 106 and may be directly bonded (e.g., chemically bonded) to the oxide 124. Since the second electrically insulative material 118 was removed and the first electrically insulative material 116 (e.g., the oxide 124 thereof) is located higher than the second electrically insulative material 118, the mask material 126 may directly overlie and bond to the first electrically insulative material 116. In some such embodiments, an edge 130 of the mask material 126 may form a so-called partition wall, which may substantially reduce or prevent exposure of the materials of the dummy region 106 and the peripheral region 108 under the mask material 126 to one or more etch chemistries to which the semiconductor device 100 (e.g., the active region 104) are exposed.

In some embodiments, the oxide 124 exhibits hydrophobic properties and the mask material 126 substantially adheres to the oxide 124. The improved adhesion of the mask material 126 to the oxide 124 may reduce or prevent etching solutions from undercutting or etching undesired portions of the semiconductor device 100, such as portions of the semiconductor device 100 located within the dummy region 106 or the peripheral region 108.

In some embodiments, a gap 128 may remain between a surface of the mask material 126 and an upper surface of the second electrically insulative material 118 in the dummy region 106. Without wishing to be bound by any particular theory, it is believed that the gap 128 is not filled with the mask material 126 due to the relatively high viscosity of the mask material 126, the relatively small width of the second electrically insulative material 118 (e.g., $W_1$ (FIG. 1A)), or both.

The mask material 126 may include a light-sensitive polymer. In some embodiments, the mask material 126 comprises a photoacid generator (PAG) or a photoacid (PAH). In some such embodiments, responsive to exposure to electromagnetic radiation (e.g., light), an incoming photon may generate an acid molecule that diffuses into the mask material 126 and catalytically causes chemical changes in the mask material 126 that result in the formation of an image. In other words, the mask material 126 may comprise a photoacid generator that is converted to an acid responsive to exposure to electromagnetic radiation. The generated acids may catalyze a reaction of the polymer composition of the mask material 126 to make such portions of the mask material 126 soluble in a developer. In other embodiments, the mask material 126 may include a photoactive compound formulated and configured to generate an acid (e.g., a radical (e.g., a proton, H+)) that catalyzes development of (e.g., polymerization of selected portions of) the mask material 126 responsive to exposure to electromagnetic radiation.

As nonlimiting examples, the mask material 126 may comprise a phenol-formaldehyde polymer (a novolak resin), an epoxy-based polymer, a poly isoprene resist, a poly-methyl methacrylate resist, a poly-methyl isopropyl ketone resist, a poly-butene-1-sulfone resist, a poly-trifluoroethyl chloroacetate resist, a copolymer-(α-cyano ethyl acrylate-α-amido ethyl acrylate resist, a poly-(2-methyl pentene-1-sulfone resist), or another resist material. However, the disclosure is not limited to the particular materials described above and the mask material 126 may comprise materials other than those described.

Without wishing to be bound by any particular theory, it is believed that because the first electrically insulative material 116 is exposed to oxidizing conditions to form the oxide 124, the oxide 124 does not include a substantial amount of dangling bonds (e.g., $H^+$). It is believed that dangling bonds may interfere with development of the mask material 126, such as by consuming protons (H+) within the mask material 126. However, the protons may be beneficial for development of the mask material 126. Accordingly, formation of the oxide 124 may substantially prevent consumption of protons in the mask material 126. By way of comparison, where the semiconductor device 100 does not include the oxide 124, in some embodiments, the mask material 126 is not completely developed, leaving undeveloped portions of the mask material 126 over the semiconductor device 100, resulting in a lack of conductive contacts being formed in locations where the mask material 126 is not developed.

Figure 1F:
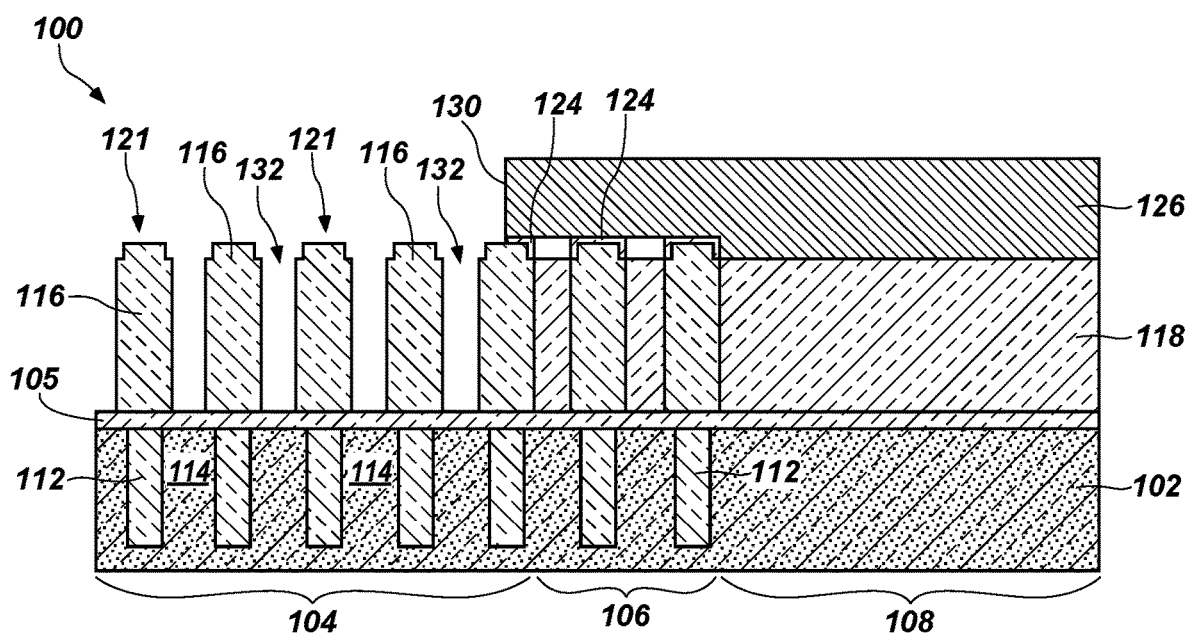

Referring to FIG. 1F, after forming the mask material 126 in the dummy region 106 and the peripheral region 108, the semiconductor device 100 may be exposed to etching conditions to remove portions of the second electrically insulative material 118 from the active region 104 and form openings (e.g., apertures) 132 between the pillars 121 of the first electrically insulative material 116. By way of nonlimiting example, the semiconductor device 100 may be exposed to one or more wet etchants formulated and configured to substantially remove the exposed portions of the second electrically insulative material 118 (FIG. 1E). The wet etchant may include, for example, to a solution including hydrofluoric acid, potassium hydroxide, a solution including hydrofluoric acid and ammonium fluoride, a solution including sulfuric acid and hydrogen peroxide, another wet etchant, or combinations thereof.

In some embodiments, the oxide 124 may also be removed during removal of the second electrically insulative material 118. In some embodiments, portions of the oxide 124 in the dummy region 106 not in contact with the mask material 126 may be removed while portions of the oxide 124 directly under the mask material 126 are not substantially removed.

Since the mask material 126 is bonded to surfaces of the oxide 124 in the dummy region 106, a gap may not exist between the mask material 126 and the oxide 124. Without wishing to be bound by any particular theory, it is believed that since the oxide 124 has a relatively low thickness T (FIG. 1D), the wet etchant does not substantially flow into the dummy region 106, such as through any space that may be formed between the mask material 126 and the first electrically insulative material 116 should the oxide 124 be removed.

Figure 1G:
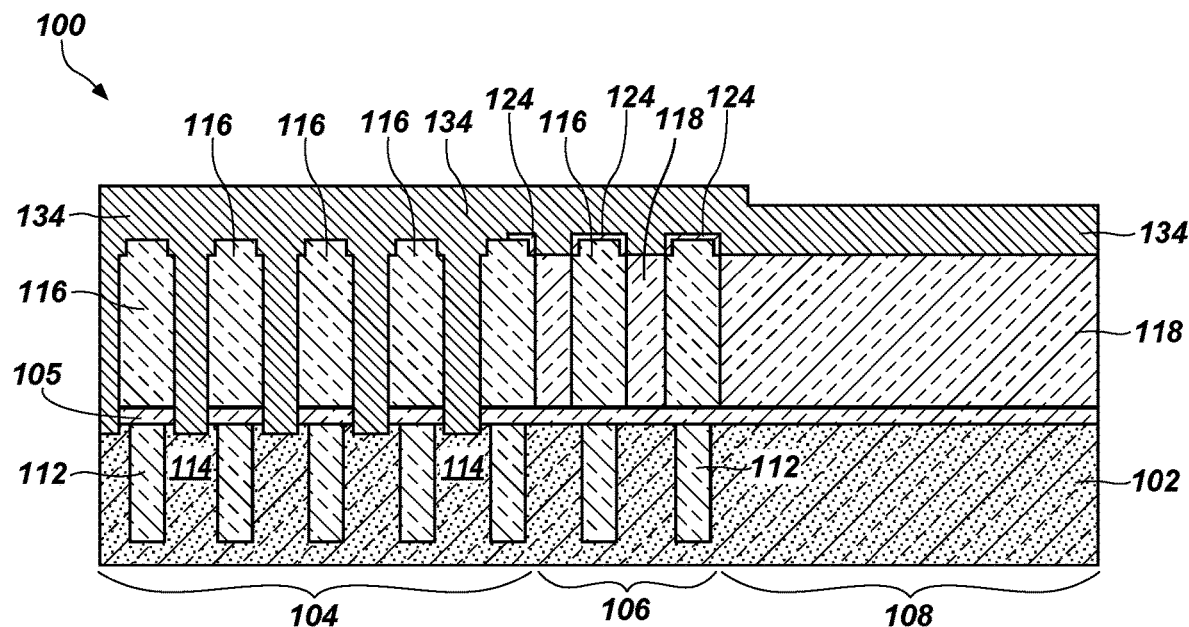

In some embodiments, the etch stop material 105 may be exposed at a bottom portion of the openings 132. Referring to FIG. 1G, after the etch stop material 105 is exposed, the etch stop material 105 within the openings 132 may be removed, such as by exposing the etch stop material to a reactive ion etch process. Removal of the etch stop material 105 may expose the active regions 114 located between the isolation regions 112 within the substrate 102.

With continued reference to FIG. 1G, an electrically conductive material 134 may be formed over surfaces of the semiconductor device 100 and within the openings 132 (FIG. 1F). The electrically conductive material 134 may be formed over and in contact with the active regions 114. Accordingly, the electrically conductive material 134 may be in electrical communication with the active regions 114. In some embodiments, a lower surface of the electrically conductive material 134 may not be coplanar with an upper surface of the substrate 102. The electrically conductive material 134 may be formed by ALD, PVD, CVD, LPCVD, PECVD, another deposition method, or combinations thereof.

The electrically conductive material 134 may include a material exhibiting a suitable electrical conductivity, such as, for example, tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the electrically conductive material 134 comprises polysilicon.

Figure 1H:
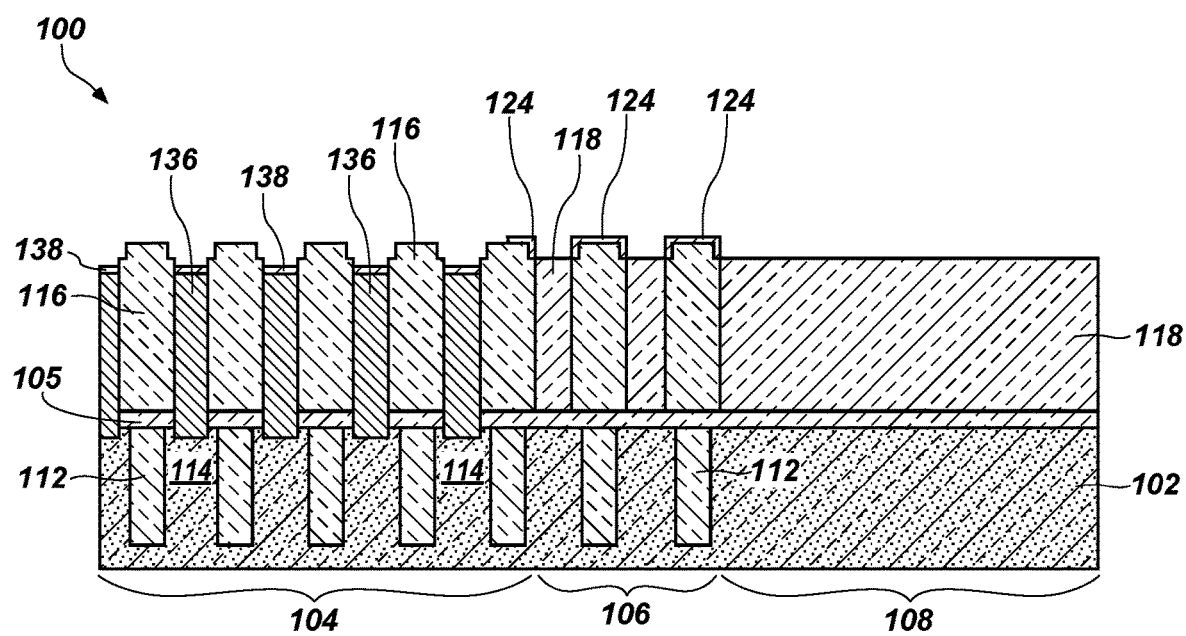

With reference to FIG. 1H, the electrically conductive material 134 may be removed from surfaces of the semiconductor device 100, such as by chemical mechanical planarization (CMP) to form electrically conductive contacts 136 between adjacent portions of the first electrically insulative material 116. The electrically conductive contacts 136 may be in electrical communication with the active regions 114.

In some embodiments, the electrically conductive contacts 136 are recessed relative to the portions of the first electrically insulative material 116. In other words, an upper surface of the electrically conductive contact 136 may be lower than an upper surface of the first electrically insulative material 116.

With continued reference to FIG. 1H, a silicide material 138 may be formed over the electrically conductive contacts 136. The silicide material 138 may comprise, for example, a metal silicide, such as cobalt silicide ($CoSi_2$), tungsten silicide ($WSi_2$), titanium silicide ($TiSi_2$), tantalum silicide ($TaSi_2$), molybdenum silicide ($MoSi_2$) nickel silicide ($NiSi_2$), another silicide, or combinations thereof. In some embodiments, the silicide material 138 comprises cobalt silicide.

In some embodiments, an upper surface of the first electrically insulative material 116 may be located further from the substrate 102 than an upper surface of the silicide material 138.

Figure 1I:
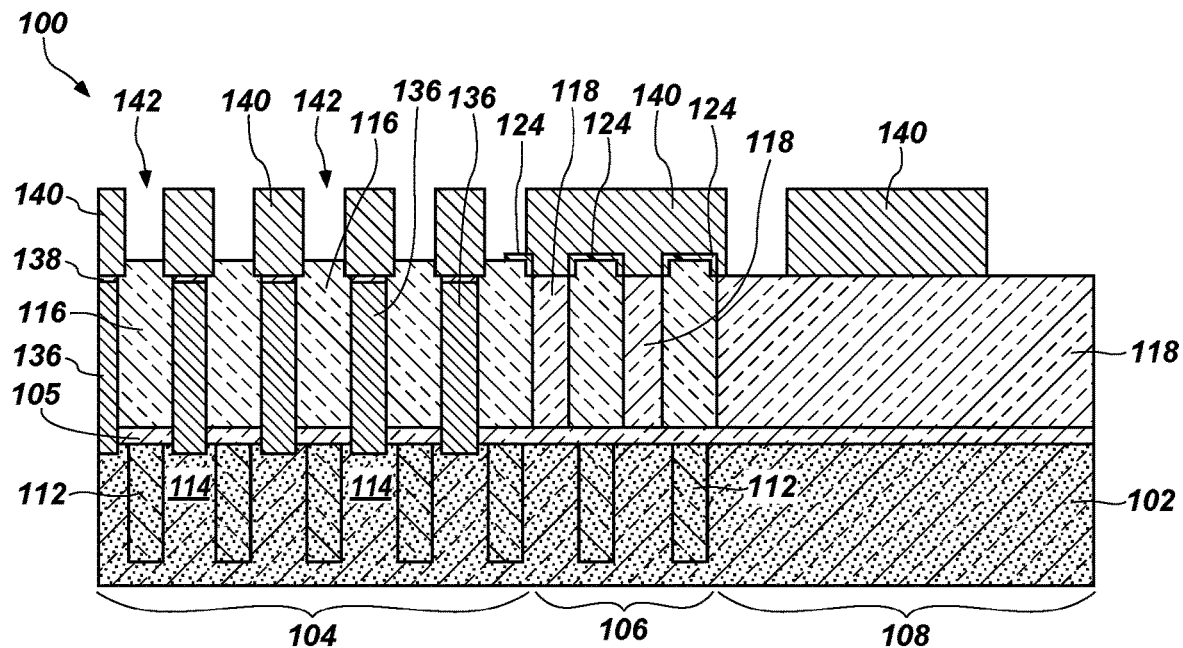

Referring to FIG. 1I, conductive contacts 140 (which may also be referred to herein as "conductive plugs" or "interconnects") may be formed and patterned over the semiconductor device 100. The conductive contacts 140 may be in electrical communication with the electrically conductive contacts 136 in the active region 104, such as through the silicide material 138. Spaces 142 between the conductive contacts 140 in the active region 104 may correspond to and be substantially laterally aligned with the first electrically insulative material 116.

The conductive contacts 140 may be substantially continuous over the dummy region 106. Stated another way, the conductive contact 140 over the dummy region 106 may be substantially unitary. In other embodiments, the conductive contact 140 in the dummy region 106 may include a plurality of conductive contacts 140, such as a conductive contact 140 over and corresponding to isolated first electrically insulative materials 116 in the dummy region 106.

One or more conductive contacts 140 may be formed over the peripheral region 108.

The conductive contacts 140 may comprise an electrically conductive material, such as, for example, tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive contacts 140 comprise tungsten.

Figure 1J:
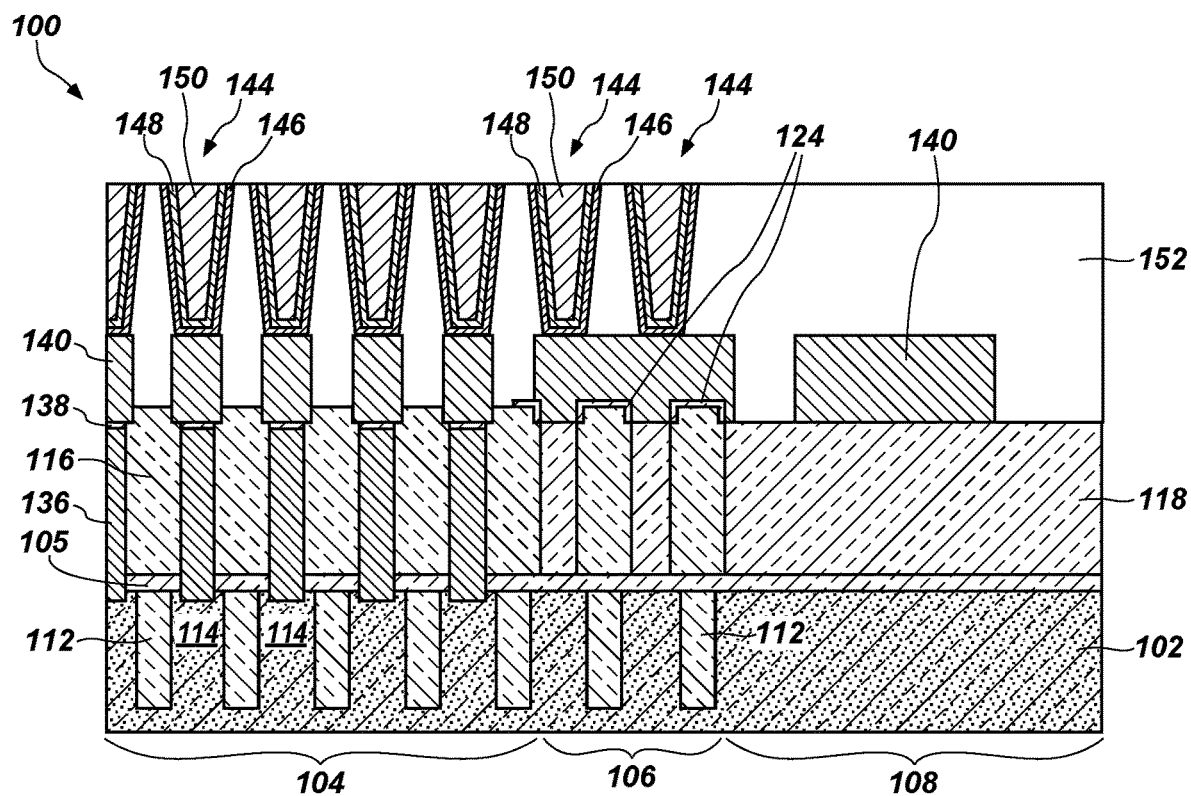

Referring to FIG. 1J, memory storage elements 144 may be formed in electrical communication with the conductive contacts 140. In some embodiments, the memory storage elements 144 comprise a capacitor. The memory storage element 144 may be formed within an insulative material

152. The insulative material 152 may comprise, for example, silicon dioxide, silicon nitride, phosphosilicate glass, borosilicate glass, borophosphosilicate glass (BPSG), fluorosilicate glass, a nitride material, an oxynitride (e.g., silicon oxynitride, another dielectric material, a dielectric carbon nitride material (e.g., silicon carbon nitride (SiCN)), a dielectric carboxynitride material (e.g., silicon carboxynitride (SiOCN)), or combinations thereof.

The memory storage element 144 may include, for example, a lower electrode 146, an upper electrode 150, and a dielectric material 148 between the lower electrode 146 and the upper electrode 150.

The lower electrode 146 may be in electrical communication with the conductive contact 140. The lower electrode 146 may include a suitable electrically conductive material, such as, for example, tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the lower electrode 146 comprises titanium nitride.

The upper electrode 150 may comprise an electrically conductive material, such as one or more of the materials described above with reference to the lower electrode 146.

The dielectric material 148 may be configured to store a charge or other property associated with a logic state of the memory storage element 144. Accordingly, the memory storage element 144 may be referred to as a "cell capacitor" or a "storage capacitor." The dielectric material 148 may include silicon dioxide, silicon nitride, polyimide, titanium dioxide (TiO$_2$), tantalum oxide (Ta$_2$O$_5$), aluminum oxide (Al$_2$O$_3$), an oxide-nitride-oxide material (e.g., silicon dioxide-silicon nitride-silicon dioxide), strontium titanate (SrTiO$_3$) (STO), barium titanate (BaTiO$_3$), hafnium oxide (HfO$_2$), zirconium oxide (ZrO$_2$), a ferroelectric material (e.g., ferroelectric hafnium oxide, ferroelectric zirconium oxide, lead zirconate titanate (PZT), etc.), a high-k dielectric material, or combinations thereof. In some embodiments, the dielectric material 148 comprises zirconium oxide.

In some embodiments, the conductive contacts 140 may arrange the memory storage elements 144 in a different configuration than the electrically conductive contacts 136 and may be referred to as a so-called "redistribution layer." In some embodiments, the electrically conductive contacts 136 are arranged in a substantially perpendicular orientation with rows and columns extending in mutually perpendicular directions and the conductive contacts 140 are arranged in a hexagonal close-packed orientation.

Accordingly, in at least some embodiments, a semiconductor device comprises a semiconductor structure, a first insulating material over the semiconductor structure, the first insulating material comprising a first aperture and a second aperture, a conductive material filling the first aperture, a second insulating material filling the second aperture, the second insulating material having a different material composition than the first insulating material, and conductive contacts over the second insulative material and over the conductive material, the conductive contacts over the conductive material separated from the conductive material by a silicide material.

Accordingly, in at least some embodiments, a semiconductor device comprises an array region, a dummy region, pillars of an electrically insulative material in the array region and the dummy region, electrically conductive contacts between adjacent pillars of the electrically insulative material in the array region, another electrically insulative material between adjacent pillars of the electrically insulative material in the dummy region, an electrically conductive material over the electrically conductive contacts in the array region and over the electrically insulative material in the dummy region, and an oxide between the electrically conductive material in the dummy region and the electrically insulative material in the dummy region.

Accordingly, in at least some embodiments, a method of forming a semiconductor device comprises forming openings in a first electrically insulative material, filling the openings with a second electrically insulative material, removing portions of the second electrically insulative material to recess upper surfaces of the second electrically insulative material relative to upper surfaces of the first electrically insulative material, oxidizing exposed surfaces of the first electrically insulative material, forming a mask material on the oxidized surfaces of the first electrically insulative material in a dummy region of the semiconductor device, removing the second electrically insulative material from an array region of the semiconductor device, removing the mask material, and forming an electrically conductive material over the semiconductor device.

Figure 2:
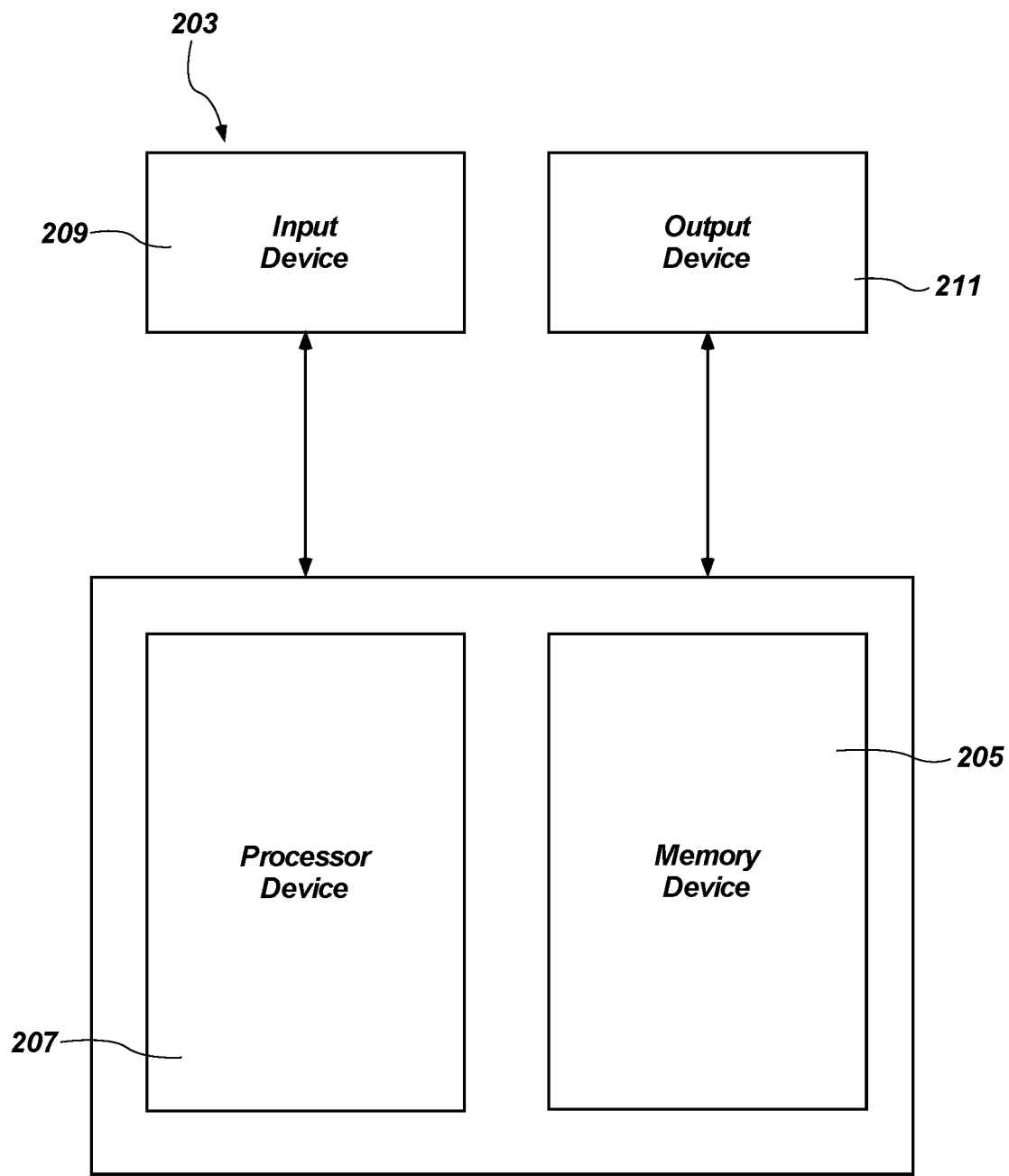
FIG. 2 is a schematic block diagram of an electronic system, in accordance with an embodiment of the disclosure.

Semiconductor devices (e.g., the semiconductor device 100) including the electrically conductive contacts (e.g., electrically conductive contacts 136) in accordance with embodiments of the disclosure may be used in embodiments of electronic systems of the disclosure. For example, FIG. 2 is a block diagram of an illustrative electronic system 203 according to embodiments of disclosure. The electronic system 203 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 203 includes at least one memory device 205. The memory device 205 may include, for example, an embodiment of a semiconductor device previously described herein (e.g., the semiconductor device 100) including the electrically conductive contacts (e.g., electrically conductive contacts 136).

The electronic system 203 may further include at least one electronic signal processor device 207 (often referred to as a "microprocessor"). The electronic signal processor device 207 may, optionally, include an embodiment of a semiconductor device previously described herein (e.g., the semiconductor device 100). The electronic system 203 may further include one or more input devices 209 for inputting information into the electronic system 203 by a user, such as, for example, a mouse or other pointing device, a keyboard, a touchpad, a button, or a control panel. The electronic system 203 may further include one or more output devices 211 for outputting information (e.g., visual or audio output) to a user such as, for example, a monitor, a display, a printer, an audio output jack, a speaker, etc. In some embodiments, the input device 209 and the output device 211 may comprise a single touchscreen device that can be used both to input information to the electronic system 203 and to output visual information to a user. The input device 209 and the output device 211 may communicate electrically with one or more of the memory device 205 and the electronic signal processor device 207. In some embodiments, more than one function may be performed by a single semiconductor die, for example in the case of a system on a chip (SoC), wherein processor and memory functions are incorporated in a single die.

Thus, in accordance with embodiments of the disclosure, a system comprises at least one processor device operably coupled to at least one input device and at least one output device, and a semiconductor device operably coupled to the at least one processor device. The semiconductor device comprises pillars of a first electrically insulative material extending from a base structure, an electrically conductive material between adjacent pillars of the first electrically insulative material in an array region, a second electrically insulative material between adjacent pillars of the first electrically insulative material in a dummy region, another electrically conductive material over the electrically conductive material in the array region and over the second electrically insulative material in the dummy region, an oxide between the electrically conductive material and the second electrically insulative material, and memory storage elements in communication with the another electrically conductive material in the array region and in dummy region.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device, comprising:
   an array region;
   a dummy region;
   pillars of an electrically insulative material in the array region and the dummy region;
   electrically conductive contacts between adjacent pillars of the electrically insulative material in the array region;
   another electrically insulative material between adjacent pillars of the electrically insulative material in the dummy region;
   an electrically conductive material over the electrically conductive contacts in the array region and over the electrically insulative material in the dummy region; and
   an oxide directly between and contacting the electrically conductive material in the dummy region and the electrically insulative material in the dummy region, the oxide on at least a portion of sidewalls of the electrically insulative material in the dummy region.

2. The semiconductor device of claim 1, wherein the electrically insulative material comprises silicon nitride.

3. The semiconductor device of claim 1, wherein the electrically conductive contacts comprise polysilicon.

4. The semiconductor device of claim 1, wherein the oxide comprises silicon dioxide.

5. The semiconductor device of claim 1, wherein the electrically conductive material comprises tungsten.

6. The semiconductor device of claim 1, further comprising a capacitor in electrical communication with the electrically conductive material over the electrically conductive contacts, the capacitor laterally aligned with at least one electrically conductive contact of the electrically conductive contacts.

7. The semiconductor device of claim 1, wherein an uppermost surface of the electrically insulative material in the array region and the dummy region is higher than an uppermost surface of the another electrically insulative material.

8. The semiconductor device of claim 1, wherein an upper portion of the electrically insulative material has a width less than a width of a lower portion of the electrically insulative material.

9. The semiconductor device of claim 1, wherein an upper surface of the electrically insulative material is located farther from an underlying substrate than an upper surface of the another electrically insulative material.

10. The semiconductor device of claim 1, wherein the another electrically insulative material between adjacent pillars of the electrically insulative material in the dummy region is surrounded by electrically insulative materials.

11. The semiconductor device of claim 1, wherein the electrically conductive material in the array region is in electrical communication with the electrically conductive contacts.

12. A semiconductor device, comprising:
   a semiconductor structure;
   a first insulating material over the semiconductor structure, the first insulating material comprising a first aperture and a second aperture;
   a conductive material filling the first aperture;
   a second insulating material filling the second aperture, the second insulating material having a different material composition than the first insulating material; and
   conductive contacts over the second insulating material and over the conductive material, the conductive contacts over the conductive material separated from the conductive material by a silicide material directly contacting the conductive contacts and the conductive material.

13. The semiconductor device of claim 12, wherein the first insulating material comprises silicon nitride.

14. The semiconductor device of claim 12, wherein the second insulating material comprises silicon dioxide.

15. The semiconductor device of claim 12, wherein the first aperture is located within an array region of the semiconductor device.

16. The semiconductor device of claim 12, wherein the second aperture is located within a dummy region of the semiconductor device.

17. The semiconductor device of claim 12, wherein an upper surface of the first insulating material is higher than an upper surface of the second insulating material.

18. The semiconductor device of claim 12, further comprising an oxide between the conductive contacts and the second insulating material, the oxide directly between and contacting the conductive contacts and the second insulating material.

19. A method of forming a semiconductor device, the method comprising:
   removing portions of a first electrically insulative material to recess upper surfaces of the first electrically insulative material relative to upper surfaces of a second electrically insulative material;

oxidizing exposed surfaces of the first electrically insulative material to form an oxide material over the first electrically insulative material in an array region and a dummy region of the semiconductor device, the oxide material on at least a portion of sidewalls of the first electrically insulative material;

forming a mask material on the oxide material in the dummy region of the semiconductor device;

removing the second electrically insulative material from the array region of the semiconductor device to form pillars of the first electrically insulative material in the array region and leave the second electrically insulative material between adjacent pillars of the first electrically insulative material in the dummy region;

removing the mask material;

forming electrically conductive contacts over the semiconductor device and between the pillars of the first electrically insulative material in the array region; and forming an electrically conductive material over the electrically conductive contacts in the array region and over the oxide material over the first electrically insulative material in the dummy region, the oxide material directly between and contacting the electrically conductive material and the first electrically insulative material in the dummy region.

20. The method of claim 19, wherein forming a mask material on the oxidized surfaces of the first electrically insulative material comprises bonding the mask material to the oxidized surfaces of the first electrically insulative material.

21. The method of claim 19, wherein forming a mask material comprises forming a photoresist material.

22. The method of claim 19, wherein oxidizing exposed surfaces of the first electrically insulative material comprises oxidizing exposed surfaces of the first electrically insulative material comprising silicon nitride.

23. A system comprising:
at least one processor device operably coupled to at least one input device and at least one output device;
a semiconductor device operably coupled to the at least one processor device, the semiconductor device comprising:
pillars of a first electrically insulative material extending from a base structure;
an electrically conductive material between adjacent pillars of the first electrically insulative material in an array region;
a second electrically insulative material between adjacent pillars of the first electrically insulative material in a dummy region;
another electrically conductive material over the electrically conductive material in the array region and over the second electrically insulative material in the dummy region;
an oxide between the another electrically conductive material and the first electrically insulative material in the dummy region, a portion of the oxide contacting sidewalls of the first electrically insulative material; and
memory storage elements in communication with the another electrically conductive material in the array region and in dummy region.

* * * * *